United States Patent [19]
Fields et al.

[11] Patent Number: 5,608,969
[45] Date of Patent: Mar. 11, 1997

[54] PROCESS FOR PRODUCING A UNIFORM COATING GRADIENT FOR A GRAVURE ROLL

[75] Inventors: Thomas R. Fields, Charlotte; Amy E. Bohr, Matthews; Kendalyn R. McCoy, Monroe, all of N.C.; Lawrence C. Forszen, Novi, Mich.

[73] Assignee: Rexam Industries Corp., Charlotte, N.C.

[21] Appl. No.: 438,838

[22] Filed: May 11, 1995

Related U.S. Application Data

[62] Division of Ser. No. 218,721, Mar. 28, 1994, Pat. No. 5,522,786.

[51] Int. Cl.⁶ .................................................... B23P 15/00
[52] U.S. Cl. .................................... 29/895.3; 492/30
[58] Field of Search .................... 29/895, 895.3; 492/30, 31, 32, 33, 34, 35, 36

[56] References Cited

U.S. PATENT DOCUMENTS

| | | |
|---|---|---|
| 2,226,086 | 12/1940 | Wilkinson . |
| 2,406,287 | 8/1946 | Grimshaw . |
| 2,638,050 | 5/1953 | King . |
| 3,093,071 | 6/1963 | Taylor . |
| 3,209,687 | 10/1965 | Levine . |
| 4,003,311 | 1/1977 | Bardin . |
| 4,152,986 | 5/1979 | Dadowski et al. . |
| 4,158,567 | 6/1979 | Honma et al. . |
| 4,187,107 | 2/1980 | Honma et al. . |
| 4,200,044 | 4/1980 | Vested . |
| 4,217,822 | 8/1980 | Milligan . |
| 4,299,165 | 11/1981 | Nichols et al. . |
| 4,307,165 | 12/1981 | Blazey et al. . |
| 4,914,556 | 4/1990 | Richardson . |
| 5,154,121 | 10/1992 | Schneider . |
| 5,401,232 | 3/1995 | Sailas .................................... 29/815.3 |

*Primary Examiner*—Irene Cuda
*Attorney, Agent, or Firm*—Bell, Seltzer, Park & Gibson, P.A.

[57] ABSTRACT

A method of making a gravure roll disclosed that produces a uniform coating gradient on a substrate. The gravure roll includes a series of cells arranged in circumferential line density sections in which the line densities progressively increase from section to section, and in which the cell volumes progressively decrease within each section, and in which the cell volumes at the end of one section are substantially the same as the cell volumes at the beginning of the next adjacent section.

4 Claims, 13 Drawing Sheets

PROCESS FOR PRODUCING A UNIFORM COATING GRADIENT FOR A GRAVURE ROLL

This application is a divisional of application Ser. No. 08/218,721, filed Mar. 28, 1994, now U.S. Pat. No. 5,522,786.

FIELD OF THE INVENTION

The present invention relates to methods of gravure coating or printing surfaces with a coating gradient.

BACKGROUND OF THE INVENTION

The invention is a method of using gravure printing or coating to produce a continuous gradient on a substrate, and in particular, a color gradient on a transparent substrate. An example of a resulting product would be a tinted window film such as those used in buildings or automobiles that have a very dark color gradient at the top to act as a sun shield, and below which the color gradient becomes progressively lighter. Numerous other applications exist such as specialized lighting or optical fixtures, as well as applications for nontransparent coatings or nontransparent substrates.

In gravure printing, a roll (i.e., a cylinder) carries a multitude of small openings on its surface called cells, and rotates in contact with both an ink supply and a web (such as paper or polyester) to be printed. The cells take up the ink from the supply and transfer it to the web. Gravure is quite economical for large scale printing or coating applications and thus is a favorable technique if an appropriate printed product results.

In most gravure processes, the cells are flooded with ink, after which a doctor blade wipes the surface of the roll (or in some cases a plate) of excess ink. Thus, the depth and size of each cell determine the amount of ink (or other fluid) that is available to be transferred to the printed (or otherwise coated) surface.

A cell has two size components. The first is its cross-sectional area, which is often described by the number of lines of cells per inch (line density) along the gravure roll. The higher the line density, the smaller the individual cells. The second component is the cell's volume, which depends upon both the cross-sectional area and the cell's depth on the roll.

The conventional gravure method for producing a color gradient is to reduce the volume of the individual cells from start to finish around the circumference of a gravure cylinder. Bigger cells pick up and distribute more ink, and smaller cells correspondingly pick up and transfer less ink. Thus, a web printed by such a roll will exhibit a pattern of more ink decreasing to less ink; i.e., a color gradient.

The conventional technique, however, tends to produce several distinct portions of the color gradient. In general terms, the first portion is produced by the largest volume cells and is essentially solid in appearance. As the cell volume decreases, the next portion appears as a continuous field of color with discontinuous unprinted dots. As the pattern progresses, the appearance changes to an unprinted continuous field with discontinous printed dots. A final portion appears as a continuous unprinted field.

An optical problem arises, however, when such gradients are produced by conventional gravure processes on transparent substrates. Specifically, the intermediate portions of the gradient (the printed field with unprinted dots) produce an optical haze on a transparent substrate. For example, if a transparent colored portion is printed on a colorless polyester substrate, the darkest colored portions, the distinct dot portions, and the uncolored portions will be optically clear. The unprinted dot portions, however, tend to be hazy. Such hazy portions are undesired or unacceptable for many purposes.

OBJECT AND SUMMARY OF THE INVENTION

Therefore, it is an object of the present invention to produce a continuous coating gradient on a substrate, and in particular an optically clear continuous color gradient on a transparent surface, using a gravure roll.

The invention meets this object with a gravure roll that produces such a uniform continuous coating gradient on a substrate in which the roll comprises a series of fluid-containing cells arranged in circumferential line density sections. The line densities progressively increase from section to section, and the cell volumes progressively decrease within each section. The cell volumes at the end of one section are substantially the same as the cell volumes at the beginning of the next adjacent section.

In another aspect, the invention is a method of producing a uniform, continuous gradient coating on a substrate.

In yet another aspect, the invention comprises a method of making a gravure roll that will produce such a uniform continuous coating gradient on a substrate.

The foregoing and other objects, advantages, and features of the invention, and the manner in which the same are accomplished, will become more readily apparent upon consideration of the following detailed description of the invention taken in conjunction with the accompanying drawings, which illustrate preferred and exemplary embodiments, and wherein:

FIG. 1 is a schematic diagram of a gravure roll divided into sections according to the present invention; and FIGS. 2–25 are optical micrographs of various portions of a gravure roll according to the present invention.

DETAILED DESCRIPTION

Figure 1:
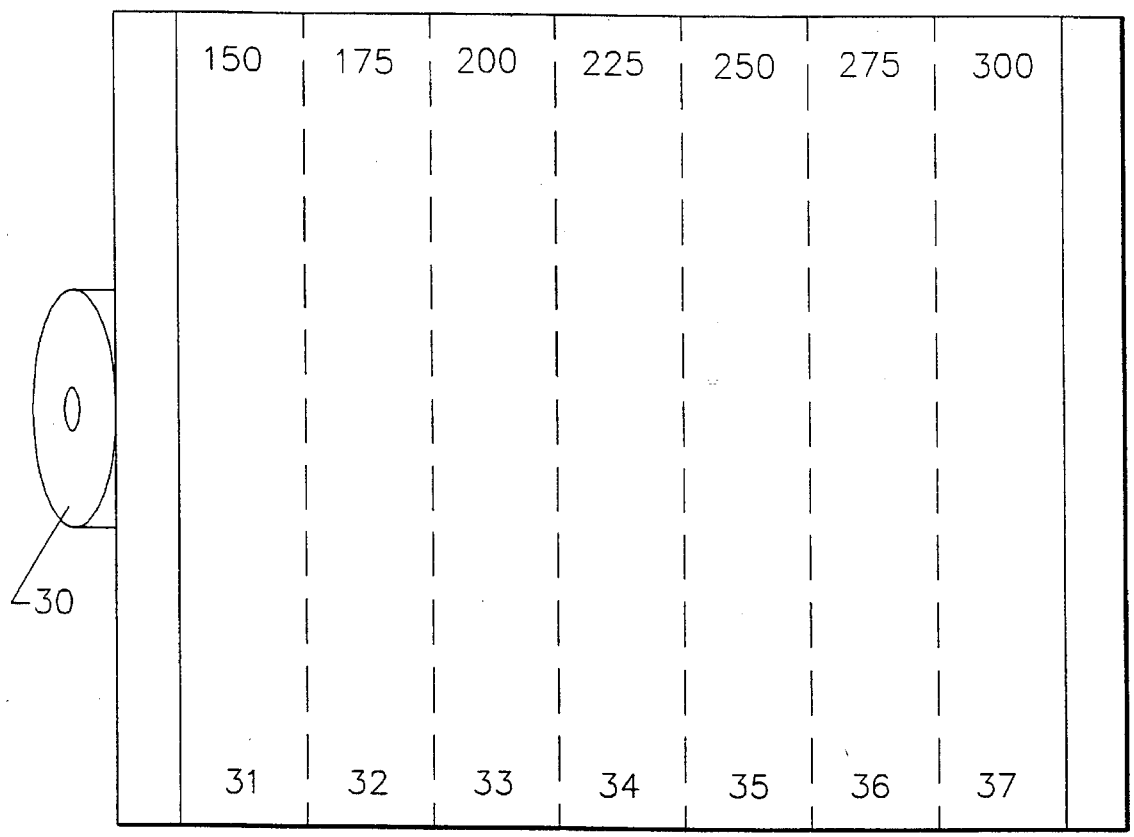
Figure 2:
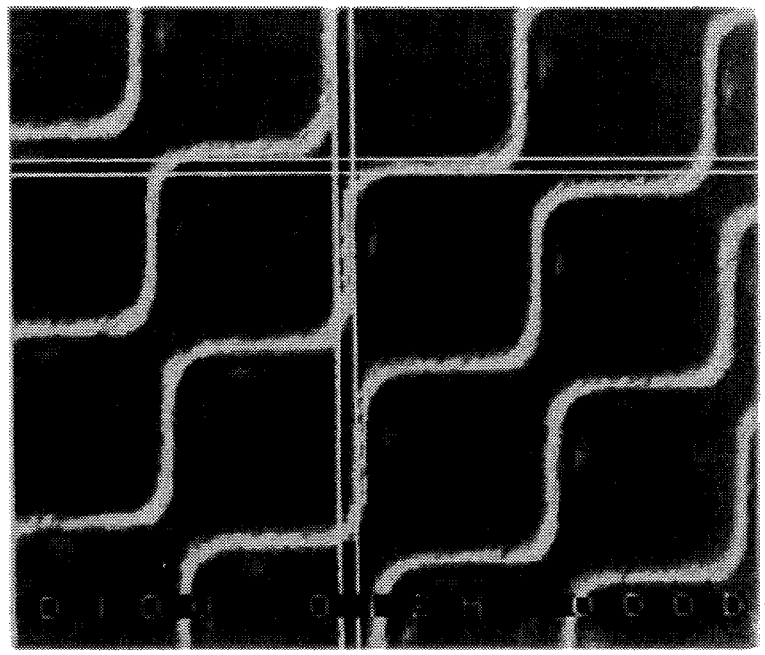
Figure 3:
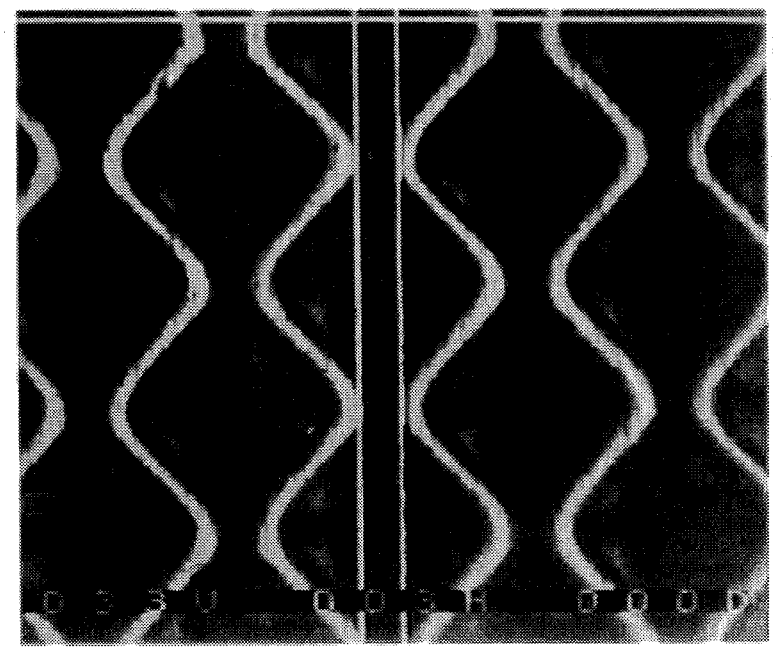

The present invention provides a gravure roll that produces a uniform continuous coating gradient on a substrate. The roll comprises a series of cells, best illustrated in the optical micrographs of FIGS. 2–25, arranged in circumferential line density sections. FIG. 1 is a schematic view of such a roll 30 having seven sections 31–37 thereon. As FIG. 1 indicates, the circumferential line density sections have line densities which progressively increase from section to section. For example, in the embodiment illustrated in FIG. 1, section 31 has a line density of 150 lines per inch. This density increases by 25 lines per inch in each of the sections until section 37 has a line density of 300 lines per inch. Within each of the sections 31–37, the cell volumes progressively decrease while the line density remains constant. At the end of one section such as 31 and the beginning of the next section 32, however, the cell volumes are substantially the same as one another. Stated differently, the smallest cell volumes in section 31 are substantially the same as the largest cell volumes at the beginning of section 32. The same relationship is maintained between each of the respective adjacent sections.

At this point, it will be readily understood that although the terms "progressively increasing" and "progressively decreasing" have been used to describe the line densities in the cell volumes, if one were speaking in the opposite direction (e.g., from right to left in FIG. 1), the cell volumes would increase within each section and the line densities would decrease from section to section. Viewed or described either way, however, the result is the same. A gravure roll according to the invention will comprise at least two line density sections (FIG. 1 illustrates seven such sections) and the sections are arranged progressively along the axial direction of the roll.

It has been determined according to the present invention that by matching the cell volumes at the borders between sections, a visible line between sections can be avoided even though the line density changes. Stated differently, if the cell volumes in section 31 were different from those of section 32 at and near the point at which the sections meet, sections 31 and 32 would display a linear border therebetween, and a transparent coated substrate would have a striped or ribboned appearance. Matching the cell volumes at the border eliminates this problem. Thus, the dotted lines in FIG. 1 are intended to schematically illustrate the borders, and do not represent physical lines on the gravure roll.

Furthermore, in order to produce a continuous color gradient without the haze or other optical problems raised by unprinted dots, in preferred embodiments the cell volumes within each section 31–37 of the roll 30 are always maintained high enough for each section to form a continuous coating on a substrate coated from the roll 30. Stated differently, even though each section delivers progressively less ink from its cells, each section always delivers enough ink (or other fluid) to form a continuous coating.

FIGS. 2–25 further illustrate the novel characteristics of the invention. First, by way of explanation, each of the optical micrographs of FIGS. 2–19 shows a plurality of cells, and each includes horizontal and vertical white lines or "crosshairs." These are used to indicate the size of the borders between cells, the size of the channels between cells, and the sizes of the cells themselves.

By way of further explanation, the micrographs are not all identical in magnification, but the relative magnification can be determined by the crosshairs. For example, FIG. 2 includes the labels "010V" and "012H." These designations indicate that the space between the vertical lines (V) is 10 microns, and the space between the horizontal lines (H) is 12 microns. In each of FIGS. 2–19, the darker areas represent the cells and represent areas indented from the surface of the roll. The lighter or white areas essentially represent borders between the cells as well as areas that are coplanar with the outermost circumference of the gravure roll.

In FIGS. 2, 6, 8, 10, 14, 16, 18, 22 and 24, the crosshairs measure the size of the borders between cells. In FIGS. 3, 7, 9, 11, 15, 17, 19, 23 and 25, the crosshairs measure the channels between cells. In FIGS. 4, 5, 12, 13, 20, and 21, the crosshairs measure the approximate cell areas.

Furthermore, some of the micrographs (e.g., FIG. 2) are taken with the cells at a 45° angle in order to allow the micrograph to measure the cell walls. Other micrographs (e.g., FIG. 3) are taken with the cells arranged substantially vertically so that the channels between the cells can similarly be measured. Thus, in FIG. 2, the designation "033V" indicates that the channel between vertically stacked cells is 33 microns.

As is well understood by those of ordinary skill in the gravure printing art, the channels between cells also need to be present and to be large enough to form a continuous coating on a substrate.

Figure 4:
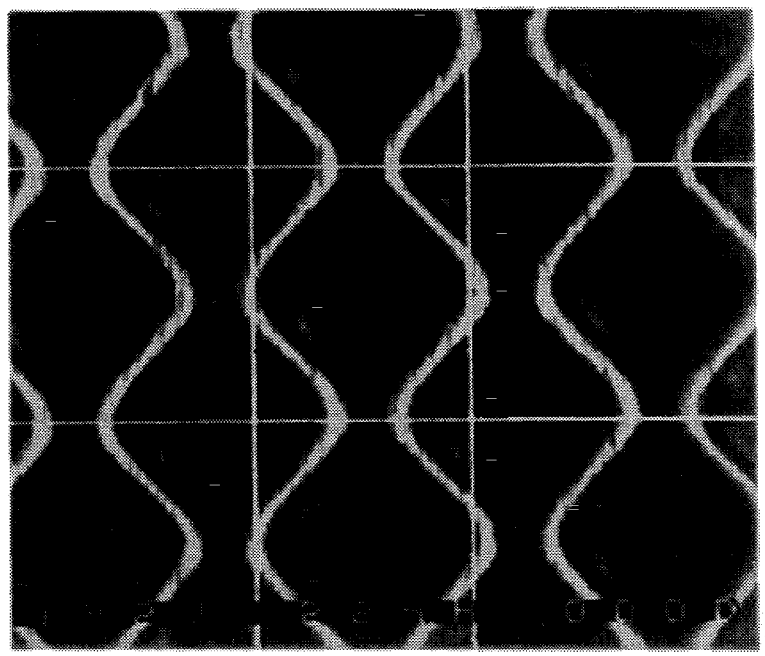
Figure 12:
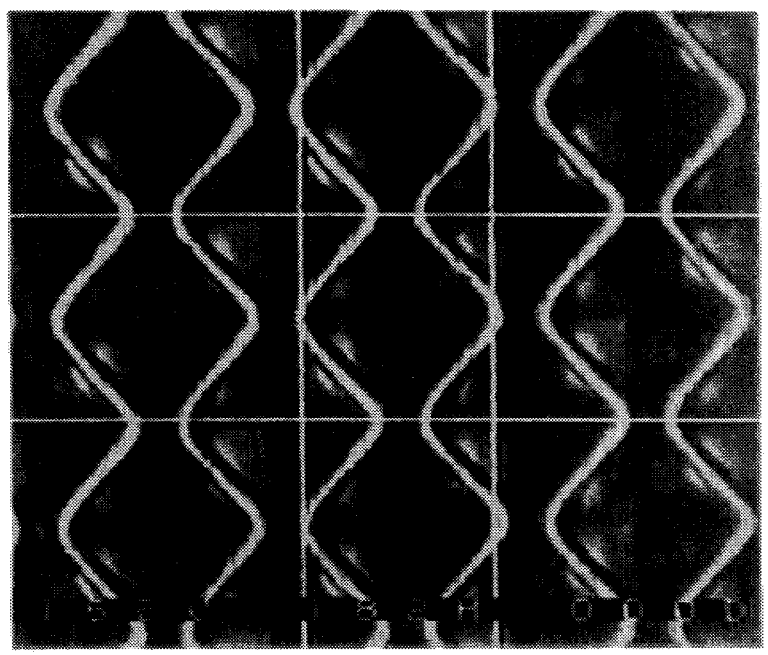
Figure 20:
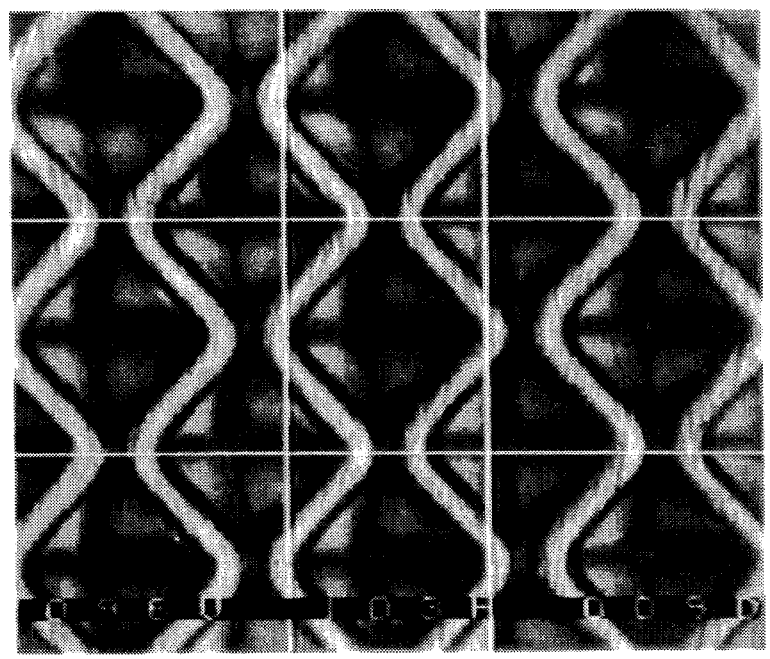

Finally, in FIGS. 4, 12, and 20, the crosshairs measure cell size; e.g., 96 microns wide and 103 microns high in FIG. 20.

Figure 5:
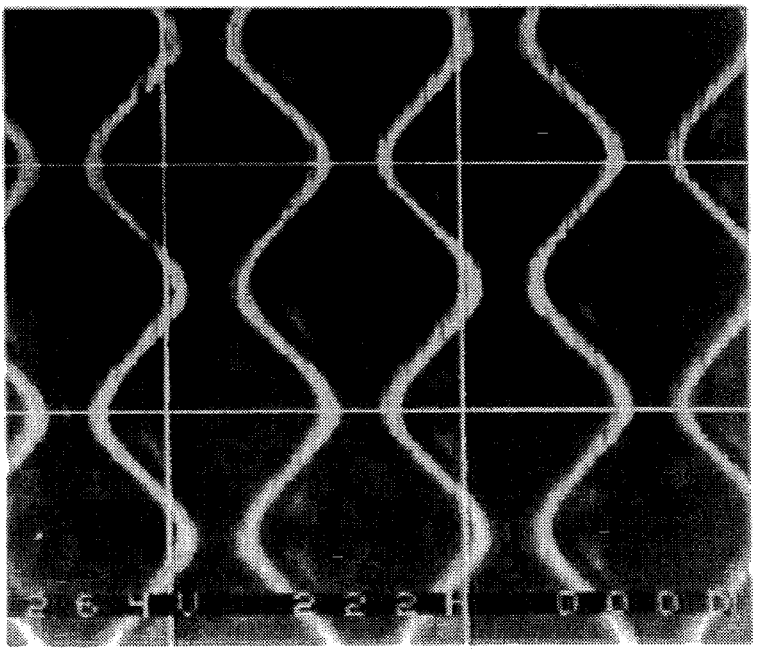
Figure 13:
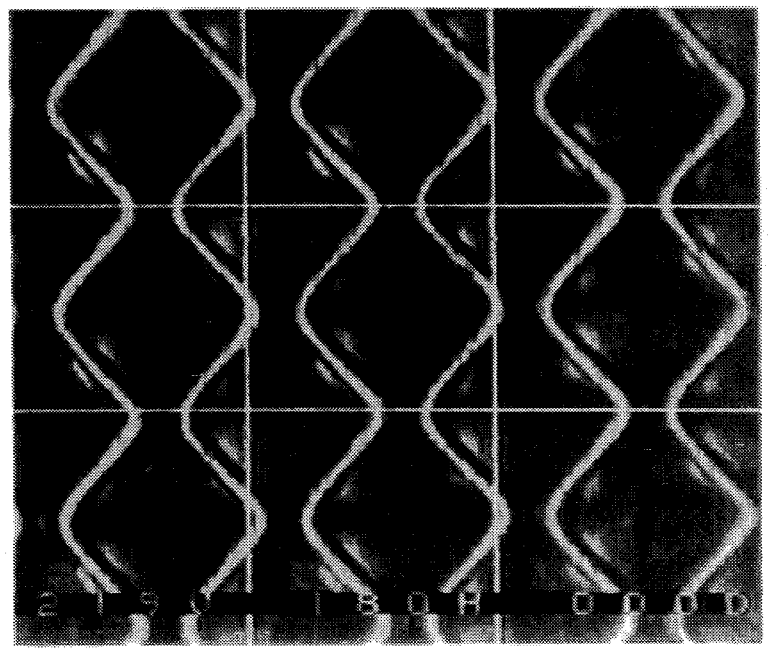
Figure 21:
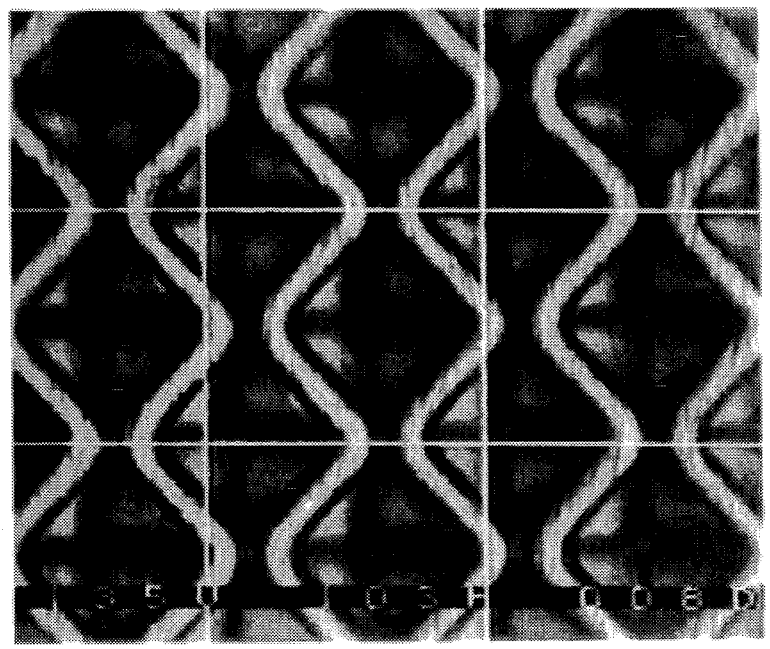
Figure 22:
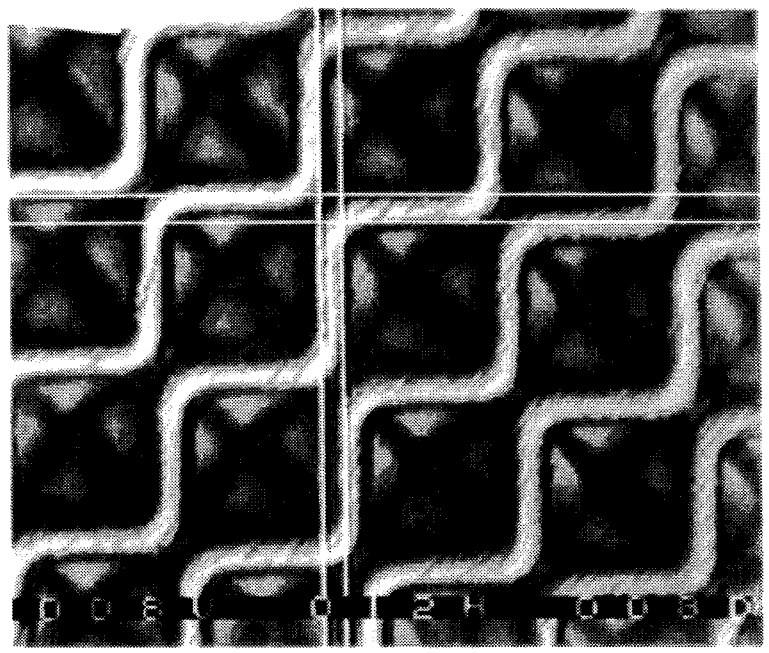
Figure 23:
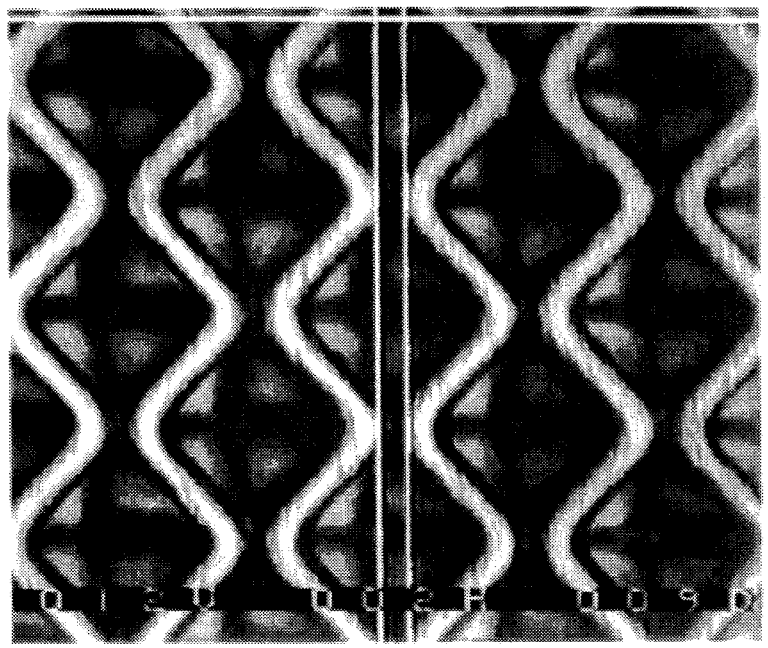
Figure 24:
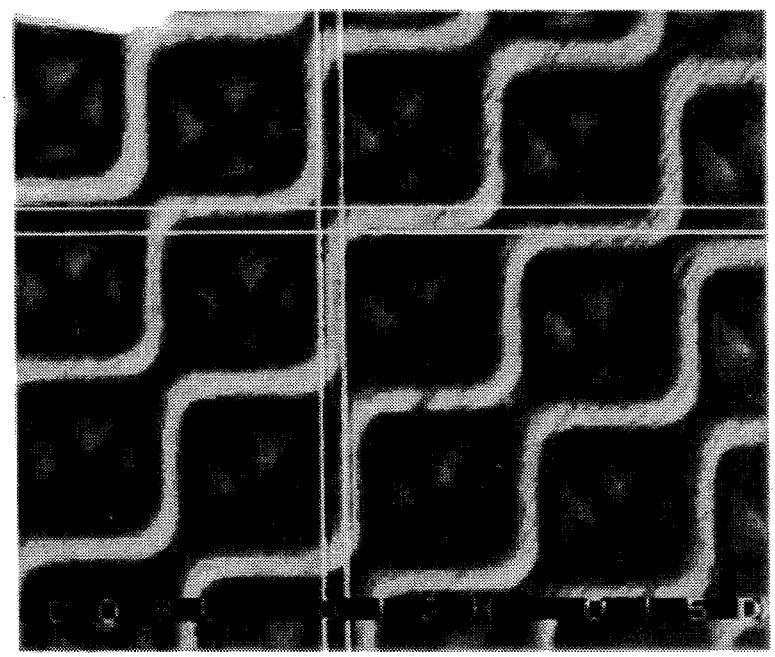
Figure 25:
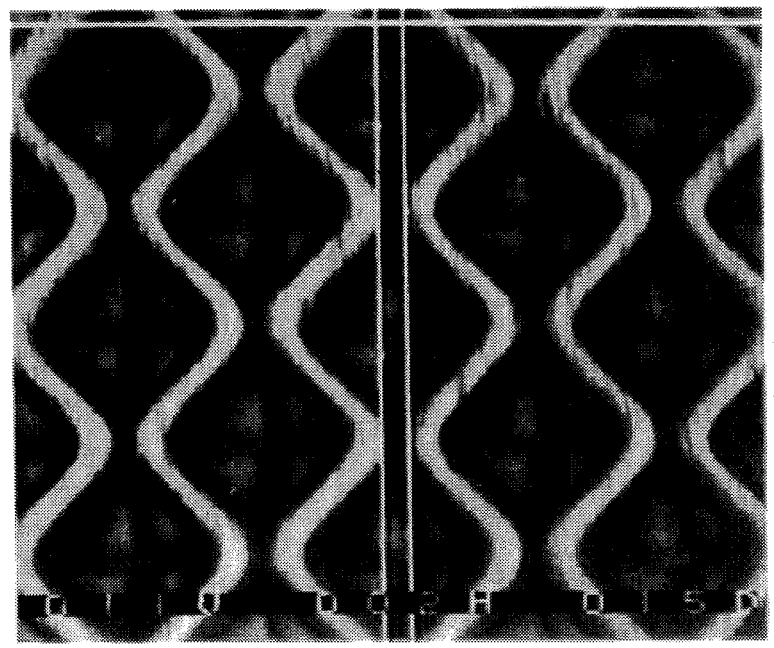

FIGS. 5, 13, and 21 measure the full width of one cell and channel pattern; e.g., 135 microns wide and 103 microns high in FIG. 21.

Figure 6:
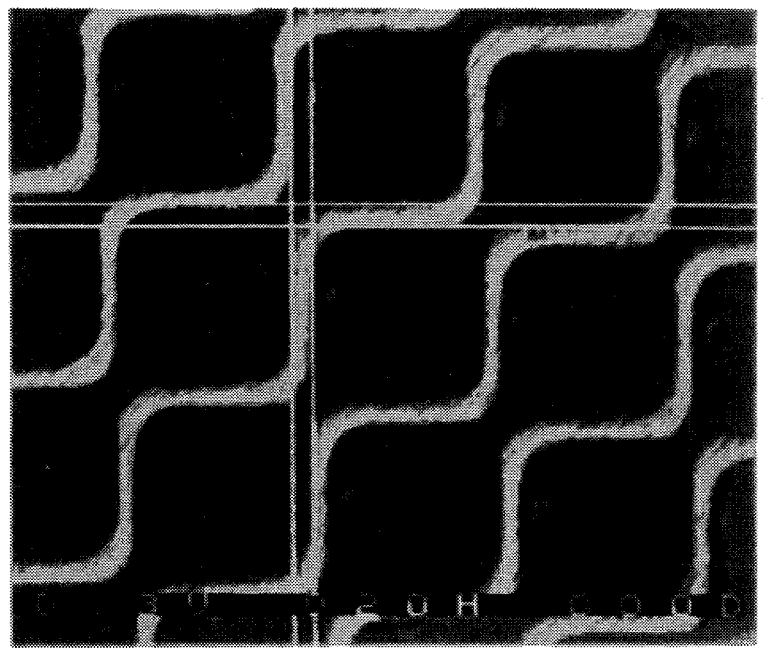
Figure 7:
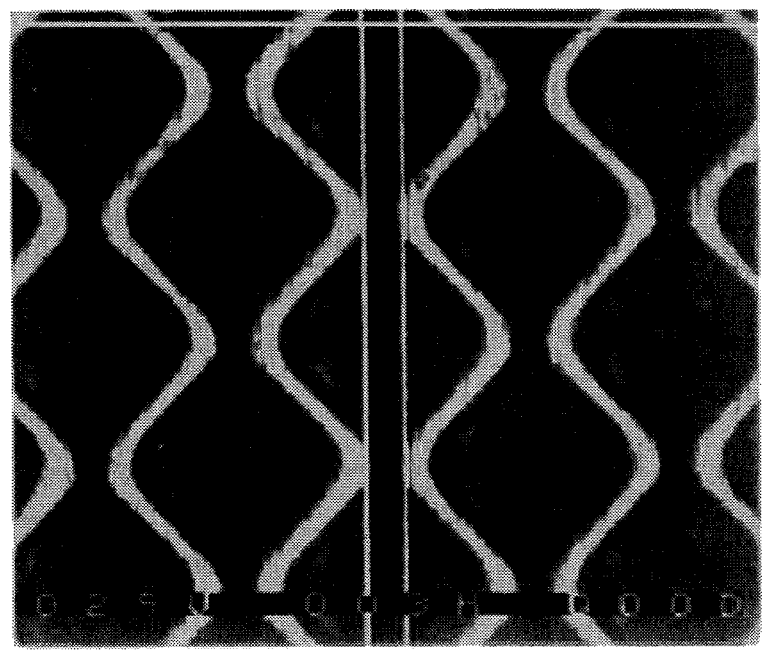
Figure 8:
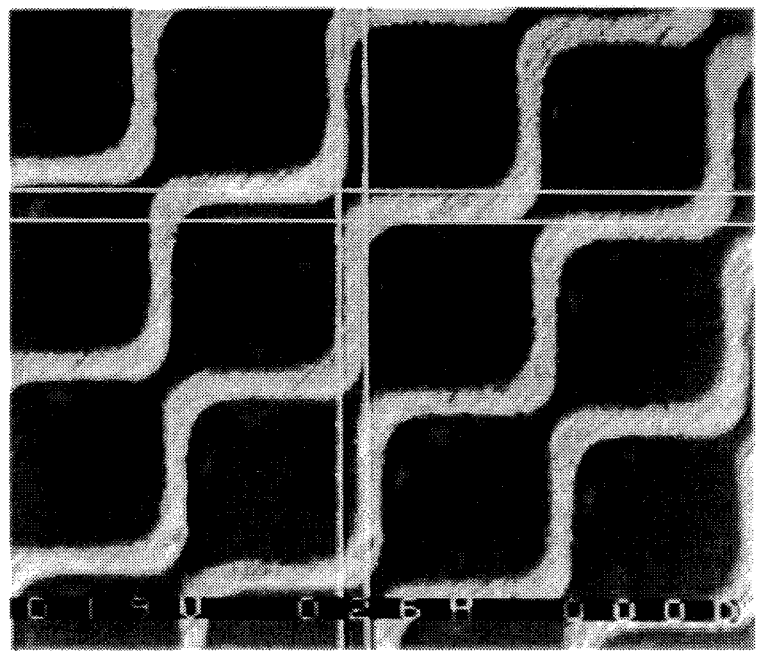
Figure 9:
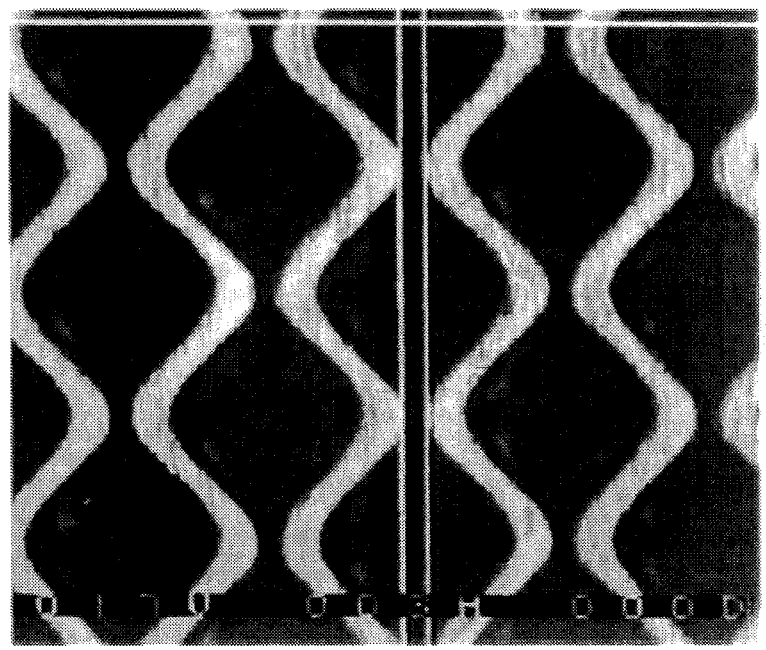

FIGS. 2–9 were all taken from a section of a gravure roll according to the present invention having a line density of 150 lines per inch, such as section 31 of FIG. 1. FIGS. 2–5 were taken from the portion having the largest cell volume, FIGS. 6 and 7 represent a middle portion of the section, and FIGS. 8 and 9 were taken from the portion having the lowest cell volume.

As FIGS. 2–9 indicate, at the beginning of the gravure roll, where the darkest color is to be applied - - - i.e., the most ink-the borders between cells are smallest (10 and 12 microns) and the channels between cells largest (33 microns). At the portion of section 31 that is adjacent section 32, however, the line density of section 31 remains the same, but the cell volumes are smaller as indicated by the larger borders and the smaller channels. Specifically, in FIG. 8, the borders between cells are 19 and 26 microns respectively (approximately double the size of those of FIG. 2) while in FIG. 9, the channel between cells is 17 microns, approximately half the 33 micron width of the channel in FIG. 3. Thus, FIGS. 2–9 indicate the progressively decreasing cell volume within section 31, but at the constant line density of 150 lines per inch. FIG. 4 illustrates that in this embodiment, a cell in section 31 has an area of about 43,000 square microns ($\mu^2$) (192 $\mu$×224 $\mu$).

Figure 10:
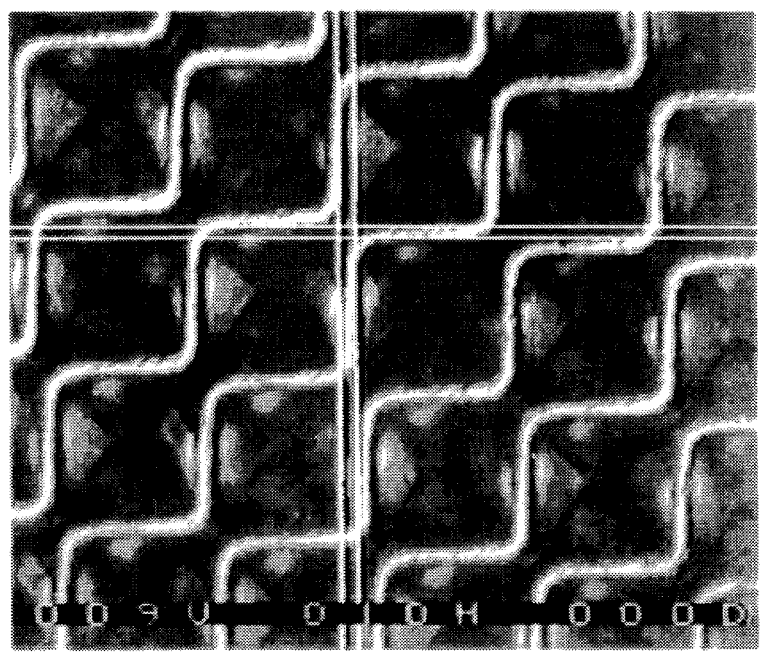
Figure 11:
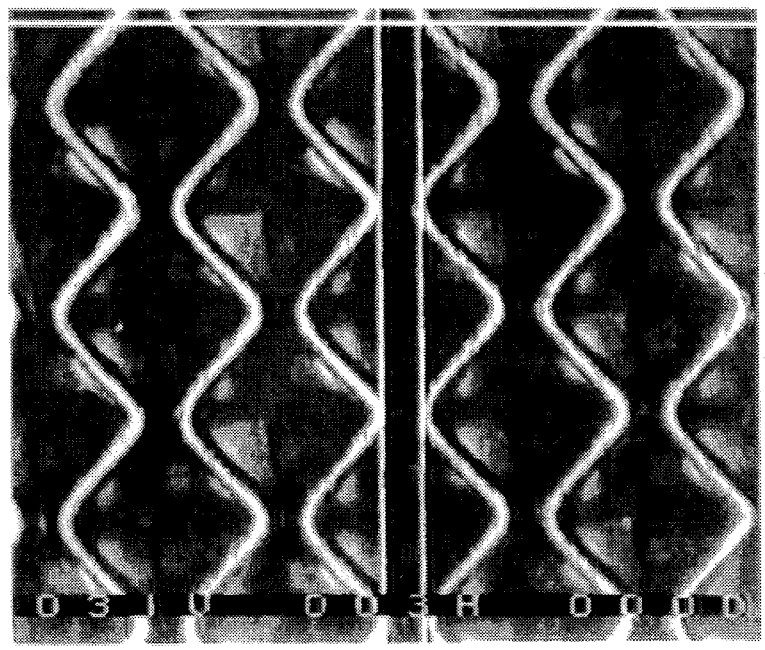

A next useful comparison is between FIGS. 8 and 9 and 10 and 11. FIGS. 10 and 11 represent the portion of section 32 in which the cell volumes are essentially the same as those of the adjacent cells in section 31, even though the line density is greater; 175 lines per inch. FIGS. 10 and 11 show that the cell walls have respective widths of 9 and 10 microns and that the channels between cells are 31 microns.

Figure 14:
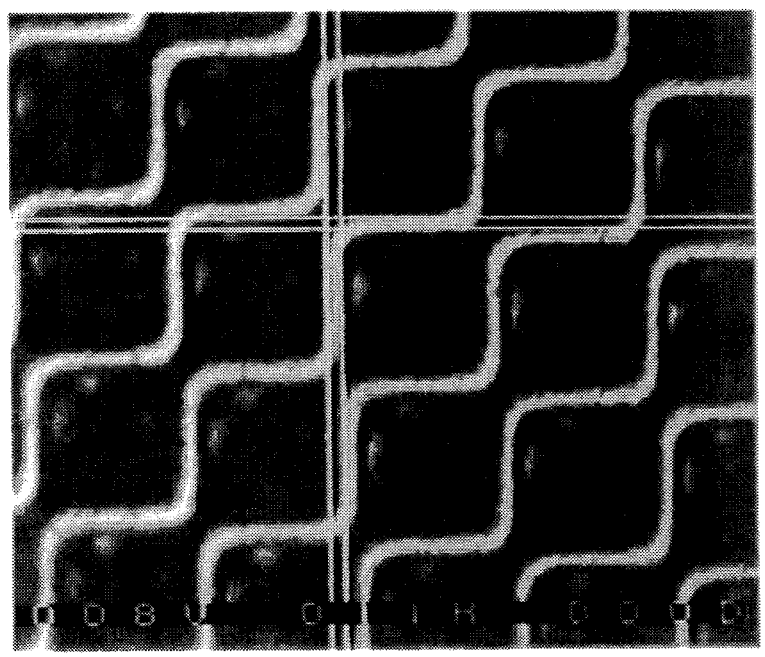
Figure 15:
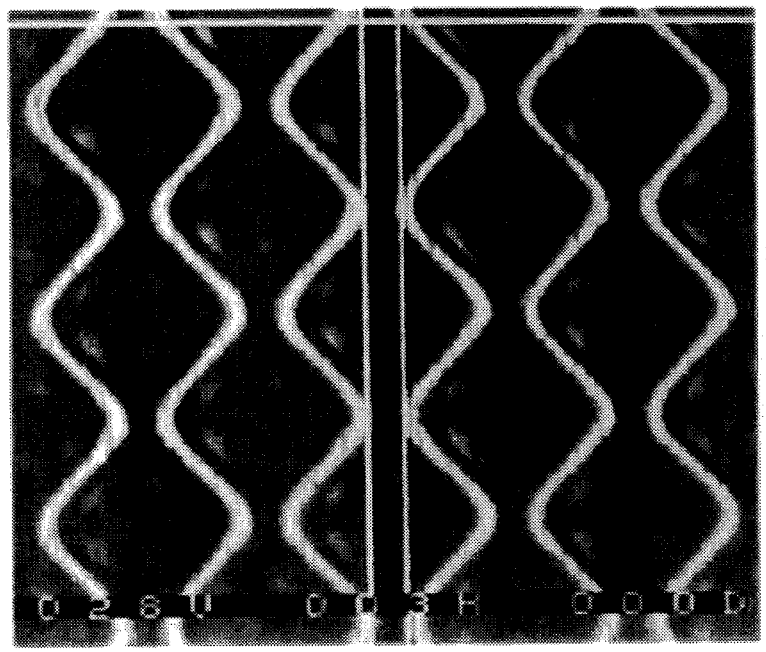
Figure 16:
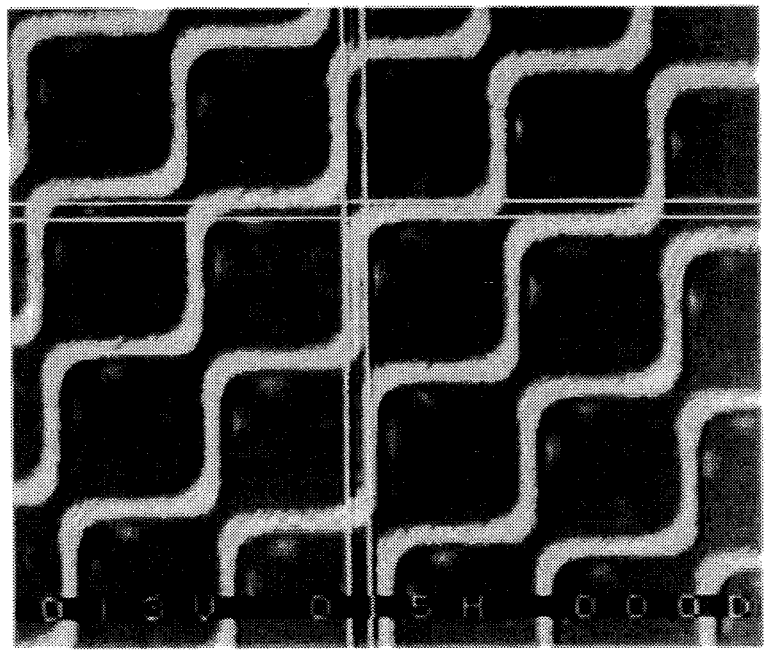
Figure 17:
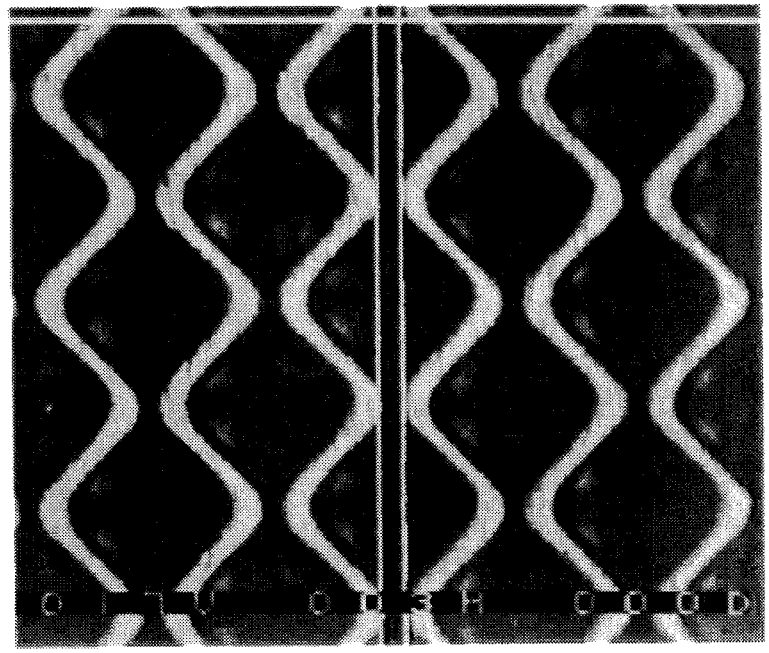
Figure 18:
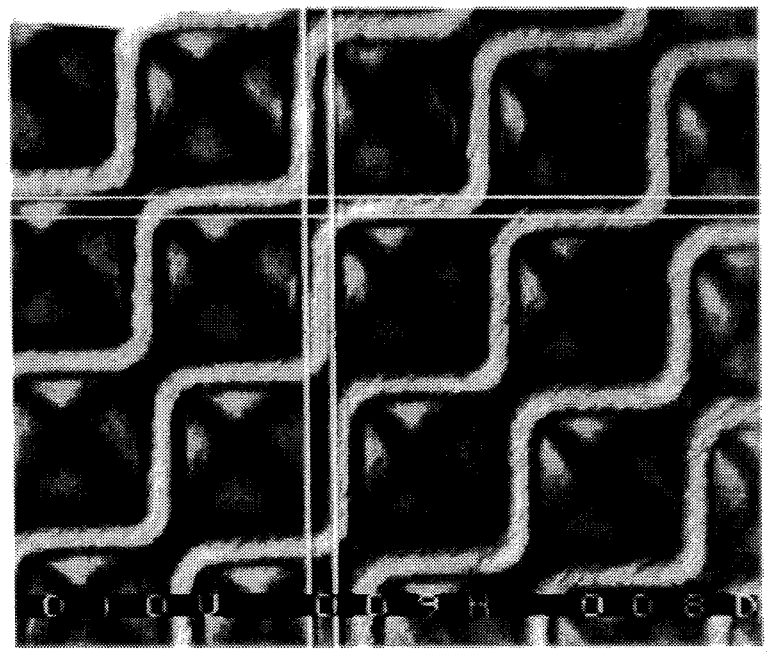
Figure 19:
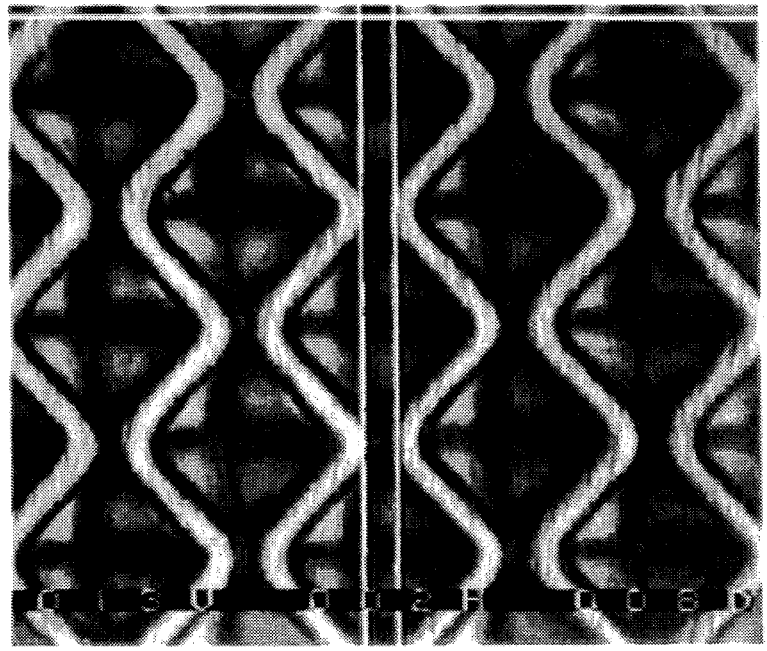

FIGS. 14 and 15 represent a middle portion of section 32, again with a line density of 175 lines per inch, but as will be noted with slightly wider cell walls and a similar or slightly more narrow channel. FIGS. 16 and 17 show the portion of section 32 that would be adjacent section 33; i.e., those cells in section 32 which would have volumes most similar to those of section 33. As can be seen therein, FIG. 16 illustrates the wider cell walls (13 and 15 microns). FIG. 12 shows that a cell in section 32 has an area of about 30,576 $\mu^2$ (168 $\mu$×82 $\mu$).

FIGS. 18–25 are taken from a gravure roll at the portion corresponding to line density section 37 in FIG. 1; i.e., a section with a line density of 300 lines per inch. Although in various magnifications, these look similar to the earlier photographs, they likewise represent higher line densities and correspondingly smaller cell volumes in a manner analogous to that already described. In particular, FIG. 20 illustrates an approximate cell area of 9,900 $\mu^2$ (96 $\mu$×103 $\mu$), an area approximately one-fourth of that of the cells in section 31.

The gravure roll 30 of the present invention can be produced by forming a first section of cells on the circumferential surface of the roll at a constant line density while concurrently progressively reducing the cell volumes along the axial direction of the roll. Then, second and succeeding sections of cells can be formed on the circumferential surface of the gravure roll adjacent to the first (or the preceding) section and at a constant line density that is greater than the line density of the first (or preceding) section, while substantially matching the volumes of the first cells in the second (or succeeding) section to the last cells in the first (or preceding) section, and while concurrently progressively reducing the cell volumes in the second (or successive) section along the axial direction of the roll.

It will be understood that when a roll such as is illustrated in FIG. 1 is used, all of the coating steps take place concurrently rather than consecutively. If sequential coating was desired or necessary, one method can include sequential coatings from sequentially arranged gravure cylinders. By aligning the cylinders appropriately, the same continuous gradient can be produced.

In a preferred embodiment, the cells are formed by electronic engraving (i.e., an electronically-controlled stylus cuts out the cells). Nevertheless, the invention is best understood in terms of the relationships of line densities from section to section and cell volumes within each section. Therefore, although electronic engraving is presently preferred, the method of the invention could also comprise mechanical engraving, chemical etching, laser engraving, or even applications that may or may not have been applied to gravure rolls, but could potentially be so applied in the future. As of the filing of this specification, these other methods have disadvantages in comparison to electronic engraving, but these other methods are theoretically quite capable of producing the required sections, line densities, and cell volumes.

The invention further comprises a method of producing a uniform coated gradient on a substrate. In this aspect, the method comprises applying a fluid coating to a first portion of a substrate by delivering the fluid to the substrate from a first section of fluid-containing cells having a constant line density, but with progressively decreasing cell volumes. The method then comprises applying a fluid coating to a second portion of the substrate adjacent to the first portion that was coated from the smallest volume cells in the first section, and from a second section of fluid-containing cells having a constant line density that is greater than the line density of the first section (i.e., smaller cells), but with progressively decreasing cell volumes. The cell volumes in the first section are maintained substantially equal to the cell volumes of the second section at the point where the first and second portions of the substrate are adjacent one another.

Preferably, the step of applying the fluid from the first and second sections of cells comprises applying the fluid from adjacent circumferential sections of cells on a gravure roll, and in the most preferred embodiment, the steps of applying the fluid from the first and second sections comprises applying a colored fluid - - - e.g., an appropriate ink - - - to a transparent substrate such as polyester. As known to those familiar with gravure printing, the step of applying the fluid coating to the substrate will generally comprise applying the fluid coating to a moving web. Additionally, the method can apply to any transparent polymer web that is otherwise suitable for the gravure process.

As noted with the description of the gravure roll itself, the method preferably comprises delivering enough fluid from each section of cells to each section of the substrate to avoid a dotted appearance and any resulting clarity problems, particularly in coating transparent substrates with colored inks.

Although the presently preferred embodiment of the invention applies a colored ink to a transparent substrate to produce a continuous color gradient, the invention can be applied to any coating technique in which a uniform gradient, including thickness control, is desired or required. For example, the method could comprise applying an adhesive coating (including transparent adhesives) to an appropriate substrate (paper, polymer, and potentially some fabrics) to produce a substrate with a desired controlled release adhesive coating that changed uniformly with the gradient. Other examples could include protective coatings, conductive coatings (for which conductivity requires continuity and quantitatively depends upon thickness), antifog coatings on lenses, goggles and masks, photochromic or electrochromic coatings (e.g., instant or conventional photography), density control, and numerous replacement techniques for half-tone techniques presently used in the graphic arts.

Because the method is essentially a gravure method, it preferably comprises the step of filling the cells with fluid coating prior to the steps of applying the fluid coating to the substrate. The method of applying ink or other material to a gravure roll is well understood in the art and will not be otherwise explained herein in further detail.

Although the method aspects of the invention can be explained with respect to first and second portions of the substrate, it will be understood that the same relationship can be carried out with third and succeeding portions of the substrate with each succeeding portion being adjacent to the portion that was coated from the smallest volume cells in the preceding section of cells. Each succeeding portion of the substrate is coated from a succeeding section of fluid-containing cells having a constant line density that is greater than the line density of the preceding section of cells, but with progressively decreasing cell volumes within each section of cells. At the same time, the cell volumes are maintained substantially equal in each preceding section to the cell volume of the respective succeeding section at the point where the respective preceding and succeeding portions of the substrate are adjacent one another.

In a final embodiment, the invention can comprise a substrate with a uniform gradient coating thereon, characterized in that the coating is continuous along the substrate as the amount of coating on the substrate changes. The preferred embodiment is a transparent substrate web with a transparent color coating that is characterized by optical clarity in all of the coated areas. In the preferred embodiment, the transparent substrate comprises polyester, but as mentioned above, the coated substrate could also include a paper product with an ink, adhesive, or other appropriate coating thereon that was required or desired.

It will be further understood that although the more common use of the invention will be to produce a continuously increasing (or continuously decreasing) gradient, the invention is just as useful to produce both increases and decreases - - - or combinations thereof - - - in a continuous gradient. For example, the invention could produce a substrate coated most heavily on its edges and most lightly in its center, with the coating gradient being continuous from heavy to light and back to heavy. The invention can produce a wide variety of similar or related patterns, with the advantage of each being that the invention provides a continuous gradient rather than a discontinuous one.

Similarly, the method of the invention can be used in sequential steps that differ from one another to produce desired overall coatings built up from continuous gradients, each of which is applied according to the present invention.

In the drawings and specification, there have been disclosed typical preferred embodiments of the invention and, although specific terms have been employed, they have been used in a generic and descriptive sense only and not for purposes of limitations, the scope of the invention being set forth in the following claims.

That which is claimed is:

1. A method of making a gravure roll that will produce a uniform coating gradient on a substrate, the method comprising:

forming a first section of cells on the circumferential surface of a cylindrical gravure roll at a constant line density while concurrently progressively reducing the cell volumes along the axial direction of the cylindrical gravure roll; and forming a second section of cells on the circumferential surface of the gravure roll adjacent to the first section, and at a constant line density that is greater than the line density of the first section, and while substantially matching the volumes of the first cells in the second section to the last cells in the first section, and while concurrently progressively reducing the cell volumes in the second section along the axial direction of the roll.

2. A method according to claim 1 wherein the steps of forming the first and section sections of cells comprise engraving the cells.

3. A method according to claim 2 and further comprising the step of engraving third and succeeding sections of cells on the circumferential surface of the gravure roll, with each section being adjacent at least one preceding section or one succeeding section, and each section having a constant line density that is greater than the line density of the immediately preceding section, and while matching the volumes of the first cells in each succeeding section to the last cells in the immediately preceding section, and while concurrently progressively reducing the cell volumes in the each section along the axial direction of the roll.

4. A method according to claim 2 wherein the step of engraving the cells is a technique selected from the group consisting of: electronic engraving, mechanical engraving, chemical etching, and laser engraving.

* * * * *

UNITED STATES PATENT AND TRADEMARK OFFICE
CERTIFICATE OF CORRECTION

PATENT NO. : 5,608,969
DATED : March 11, 1997
INVENTOR(S) : Fields et al.

It is certified that error appears in the above-identified patent and that said Letters Patent is hereby corrected as shown below:

Column 1, line 62, "discontinous" should be -- discontinuous --.

Column 4, line 14, after "cells" insert -- are --.

Column 7, line 17, "section" should be -- second --.

Signed and Sealed this

Sixth Day of January, 1998

Attest:

Attesting Officer

BRUCE LEHMAN

Commissioner of Patents and Trademarks